United States Patent
Ping et al.

(10) Patent No.: US 11,887,859 B2
(45) Date of Patent: Jan. 30, 2024

(54) METHOD FOR FORMING ACTIVE REGION ARRAY AND SEMICONDUCTOR STRUCTURE

(71) Applicant: CHANGXIN MEMORY TECHNOLOGIES, INC., Hefei (CN)

(72) Inventors: Erxuan Ping, Hefei (CN); Zhen Zhou, Hefei (CN); Yanghao Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 324 days.

(21) Appl. No.: 17/372,878

(22) Filed: Jul. 12, 2021

(65) Prior Publication Data
US 2021/0343537 A1 Nov. 4, 2021

Related U.S. Application Data

(63) Continuation of application No. PCT/CN2021/078068, filed on Feb. 26, 2021.

(30) Foreign Application Priority Data

Mar. 2, 2020 (CN) .......................... 202010134688.8

(51) Int. Cl.
*H01L 21/308* (2006.01)
*H10B 12/00* (2023.01)

(52) U.S. Cl.
CPC ........ *H01L 21/3086* (2013.01); *H10B 12/053* (2023.02); *H10B 12/34* (2023.02)

(58) Field of Classification Search
CPC .......... H10B 12/00–34; H01L 21/0332; H01L 21/0334; H01L 21/0335; H01L 21/0337; H01L 21/0338
See application file for complete search history.

(56) References Cited

U.S. PATENT DOCUMENTS

| 6,063,688 A | 5/2000 | Doyle |
| 6,570,220 B2 | 5/2003 | Doyle |

(Continued)

FOREIGN PATENT DOCUMENTS

| CN | 101180708 A | 5/2008 |
| CN | 109216168 A | 1/2019 |

(Continued)

OTHER PUBLICATIONS

International Search Report in the international application No. PCT/CN2021/078068, dated Apr. 25, 2021, 2 pgs.

*Primary Examiner* — Walter H Swanson
(74) *Attorney, Agent, or Firm* — Cooper Legal Group, LLC

(57) ABSTRACT

A method for forming an active region array and a semiconductor structure are provided. The method for forming the active region array includes the steps of: providing a substrate; forming a first mask layer on a surface of the substrate, a first etched pattern being provided in the first mask layer; forming a second mask layer covering a surface of the first mask layer; forming a third mask layer having a second etched pattern on a surface of the second mask layer; forming a flank covering a sidewall of the second etched pattern; removing the third mask layer to form a third etched pattern between adjacent flanks; etching the first mask layer along the third etched pattern to form a fourth etched pattern in the first mask layer; and etching the substrate along the first etched pattern and the fourth etched pattern, to form multiple active regions in the substrate.

18 Claims, 16 Drawing Sheets

(56) References Cited

U.S. PATENT DOCUMENTS

| | | |
|---|---|---|
| 7,429,536 B2 | 9/2008 | Abatchev |
| 8,207,614 B2 | 6/2012 | Abatchev |
| 8,865,547 B2 | 10/2014 | Kang |
| 9,099,402 B2 | 8/2015 | Abatchev |
| 10,361,080 B2 | 7/2019 | Chang et al. |
| 2002/0043690 A1 | 4/2002 | Doyle |
| 2006/0263699 A1 | 11/2006 | Abatchev |
| 2008/0290527 A1 | 11/2008 | Abatchev |
| 2012/0228742 A1 | 9/2012 | Abatchev |
| 2019/0013201 A1* | 1/2019 | Chang .................... H10B 12/09 |
| 2019/0139767 A1* | 5/2019 | Shih .................... H01L 21/0338 |

FOREIGN PATENT DOCUMENTS

| | | |
|---|---|---|
| CN | 208923132 U | 5/2019 |
| CN | 110571138 A | 12/2019 |
| CN | 209785878 U | 12/2019 |

\* cited by examiner

METHOD FOR FORMING ACTIVE REGION ARRAY AND SEMICONDUCTOR STRUCTURE

CROSS-REFERENCE TO RELATED APPLICATION

The present application is a continuation application of the International Application No. PCT/CN2021/078068, filed on Feb. 26, 2021, which claims priority to Chinese Patent Application No. 202010134688.8, filed on Mar. 2, 2020. Both of them are entitled "METHOD FOR FORMING ACTIVE REGION ARRAY AND SEMICONDUCTOR STRUCTURE". International Application No. PCT/CN2021/078068 and Chinese Patent Application No. 202010134688.8 are hereby incorporated by reference in their entireties.

TECHNICAL FIELD

The disclosure relates to the technical field of semiconductor manufacture, and more particularly, to a method for forming an active region array and a semiconductor structure.

BACKGROUND

As a common semiconductor structure in electronic devices such as computers, a dynamic random access memory (DRAM) is composed of multiple storage units, and each storage unit typically includes a transistor and a capacitor. The transistor includes a gate electrically connected to a word line, a source electrically connected to a bit line, and a drain electrically connected to the capacitor. A voltage on the word line can control on and off of the transistor, such that through the bit line, data information stored in the capacitor can be read, or data information can be written into the capacitor.

In a substrate of the semiconductor structure such as the DRAM, multiple active regions arranged in an array are provided to form an active region array. For formation of the active regions, an active region auxiliary line is divided through a circular pattern into active region island structures; and then, the substrate is etched with the active region island structures as masks to form multiple active regions arranged in the array. However, the formation of the circular pattern mainly depends on single-pattern or Lithography Etch Lithography Etch (LELE). While the size of a node is reduced, the process of forming the active region array with the LELE will be restricted by the precision of a lithography process.

Therefore, how to further reduce the size of the active region to improve the arrangement density of active regions in the active region array is a technical problem to be solved urgently at present.

SUMMARY

The disclosure provides a method for forming an active region array and a semiconductor structure, to solve the problem that the size of the active region cannot be further reduced at present, and to improve the arrangement density of the active regions in the active region array, and improve the performance of the semiconductor structure.

To solve the above-mentioned problem, the disclosure provides a method for forming an active region array, which includes the following steps.

A substrate is provided.

A first mask layer is formed on a surface of the substrate, a first etched pattern being provided in the first mask layer.

A second mask layer covering a surface of the first mask layer is formed.

A third mask layer having a second etched pattern is formed on a surface of the second mask layer.

A flank covering a sidewall of the second etched pattern is formed.

The third mask layer is removed to form a third etched pattern between adjacent flanks.

The first mask layer is etched along the third etched pattern to form a fourth etched pattern in the first mask layer.

The substrate is etched along the first etched pattern and the fourth etched pattern to form multiple active regions in the substrate.

Optionally, the step that the first mask layer is formed on the surface of the substrate includes the following specific steps.

A fourth mask layer and a fifth mask layer covering a surface of the fourth mask layer are sequentially formed on the surface of the substrate.

The first mask layer covering a surface of the fifth mask layer is formed.

The first mask layer is etched to form multiple first etched patterns, the first etched patterns dividing the first mask layer into multiple first active lines.

Optionally, the step that the second mask layer covering the surface of the first mask layer is formed may include the following specific steps.

A sixth mask layer filling the first etched pattern and covering the surface of the first mask layer is deposited.

The second mask layer is deposited on a surface of the sixth mask layer.

Optionally, the step that the third mask layer having the second etched pattern is formed on the surface of the second mask layer may include the following specific steps.

The third mask layer is deposited on the surface of the second mask layer along a direction perpendicular to the substrate.

A photoresist layer is formed on a surface of the third mask layer, an opening being provided in the photoresist layer.

The third mask layer is etched along the opening to form the second etched pattern in the third mask layer.

Optionally, the specific step that the fourth etched pattern is formed in the first mask layer may include the following specific step.

The second mask layer, the sixth mask layer and the first mask layer are sequentially etched along the third etched pattern, to form the fourth etched pattern exposing the fifth mask layer, the fourth etched pattern cutting one first active line into multiple segments.

Optionally, the step that the substrate is etched along the first etched pattern and the fourth etched pattern may include the following specific step.

The fifth mask layer is etched along the first etched pattern and the fourth etched pattern, to respectively form a fifth etched pattern and a sixth etched pattern in the fifth mask layer, the fifth etched pattern and the sixth etched pattern dividing the fifth mask layer into multiple second active lines.

Optionally, the step that the substrate is etched along the first etched pattern and the fourth etched pattern may further include the following specific step.

A clad layer covering the second active line is formed.

The fourth mask layer and the substrate are sequentially etched along the fifth etched pattern and the sixth etched pattern, to form multiple active regions in the substrate.

Optionally, the material of the clad layer is the same as that of the fifth mask layer.

Optionally, the first etched pattern and the third etched pattern are trenches, and the third etched pattern is wider than the first etched pattern.

To solve the above-mentioned problem, the disclosure further provides a semiconductor structure, which includes a substrate and an active region arry.

The active region array is formed with any one of the above methods for forming the active region array.

According to the method for forming the active region array and the semiconductor structure provided by the disclosure, after the first mask layer having the first etched pattern is formed on the substrate, the second etched pattern and the third etched pattern are successively formed on the surface of the first mask layer, i.e., the first mask layer is divided by self-aligned double patterning (SADP). The disclosure avoids a limitation of the lithography precision of the single-pattern or LELE on the size of an active region, which further reduce the size of the active region, and further increase the density of the active region array in the substrate, thereby improving the performance of the semiconductor structure.

DETAILED DESCRIPTION

Specific examples of a method for forming an active region array and a semiconductor structure provided by the disclosure will be described below in detail in combination with the accompanying drawings.

Figure 1:
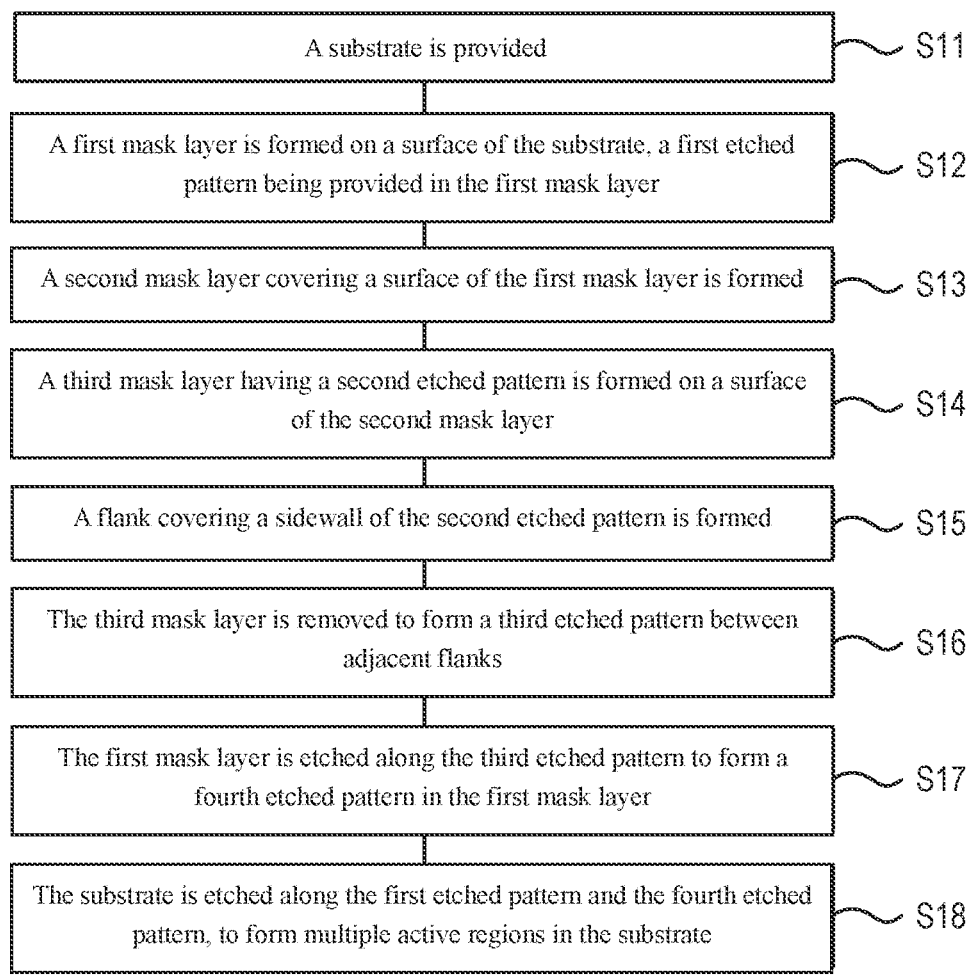
FIG. 1 illustrates a flowchart of a method for forming an active region array according to a specific example of the disclosure.
Figure 2A:
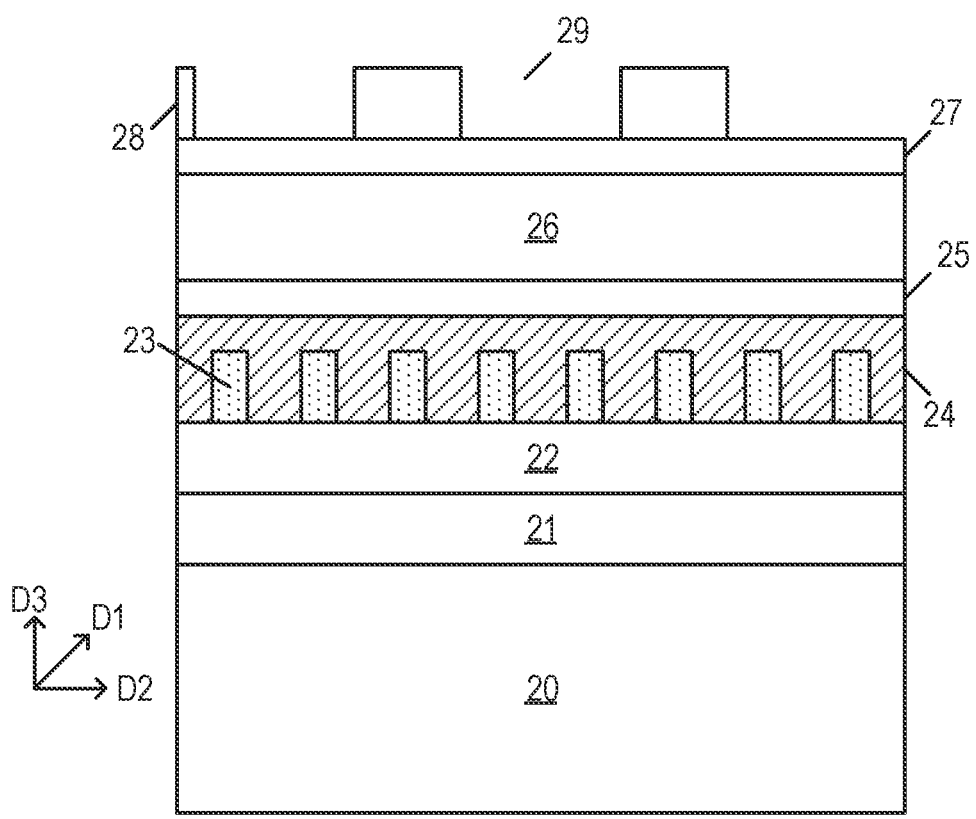
FIGS. 2A-2N illustrate a main process sectional view in a process of forming an active region array according to a specific example of the disclosure.
Figure 2B:
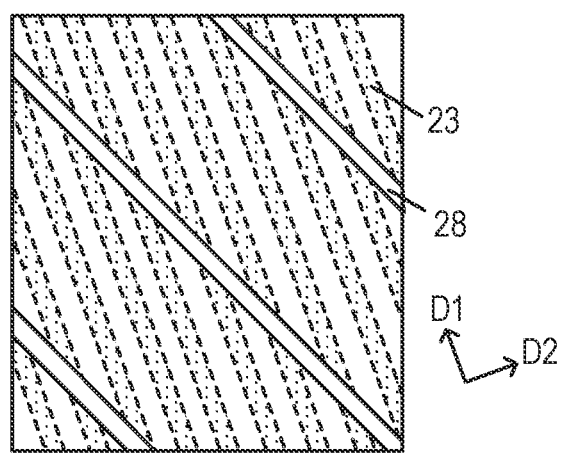

A specific example provides a method for forming an active region array. FIG. 1 illustrates a flowchart of a method for forming an active region array according to a specific example of the disclosure. FIGS. 2A-2N illustrate a main process sectional view in a process of forming an active region array according to a specific example of the disclosure. As shown in FIG. 1 and FIGS. 2A-2N, the method for forming the active region array provided by the specific example includes the following steps.

In S11, a substrate 20 is provided, as shown in FIG. 2A.

In S12, a first mask layer is formed on a surface of the substrate 20. A first etched pattern 231 is provided in the first mask layer. The first etched pattern 231 is shown in FIG. 2I.

Optionally, the specific step that the first mask layer is formed on the surface of the substrate 20 includes the following steps.

A fourth mask layer 21 and a fifth mask layer 22 covering a surface of the fourth mask layer 21 are sequentially formed on the surface of the substrate 20.

The first mask layer covering a surface of the fifth mask layer 22 is formed.

The first mask layer is etched to form multiple first etched patterns 231. The first etched patterns 231 divide the first mask layer into multiple first active lines 23, as shown in FIG. 2A and FIG. 2B. FIG. 2B is a top structural view of the structure shown in FIG. 2A.

Specifically, the material of the substrate 20 may be but not limited to silicon. The substrate 20 is configured to form the active region array in subsequent processes. In order to avoid damage of the substrate 20 from the process of forming the mask layer, before the first mask layer is formed on the substrate 20, the fourth mask layer 21 and the fifth mask layer 22 covering a surface of the fourth mask layer 21 away from the substrate 20 are further sequentially formed on the surface of the substrate 20. The fourth mask layer 21 and the fifth mask layer 22 should have a high etch selectivity ratio, for example, the etch selectivity ratio is more than 3, so as to facilitate subsequent selective etching on the fourth mask layer 21. The material of the fourth mask layer 21 may be an oxide material, such as silicon oxide, but not limited thereto. The material of the fifth mask layer 22 may be a polysilicon material, but not limited thereto.

After the first mask layer covering the surface of the fifth mask layer 22 is formed, the first mask layer may be etched by lithography and etching, to form the multiple first etched patterns 231. For example, each of the first etched patterns 231 is a trench penetrating through the first mask layer along a direction perpendicular to the substrate 20. The first etched patterns 231 divide the first mask layer into multiple first active lines 23 that are independent of one another. The first active lines 23 extend along a first direction D1, and are arranged in parallel along a second direction D2 which is intersected with the first direction D1. The intersection in the specific example may be perpendicular intersection, and may also be oblique intersection. The multiple pieces in the specific example refer to two or more pieces, and multiple strips refer to two or more strips.

In S13, a second mask layer 25 covering a surface of the first mask layer is formed, as shown in FIG. 2A.

Optionally, the step that the second mask layer 25 covering the surface of the first mask layer is formed may include the following specific steps.

A sixth mask layer 24 filling up the first etched pattern 231 and covering the surface of the first mask layer is deposited.

The second mask layer 25 is deposited on a surface of the sixth mask layer 24, as shown in FIG. 2A.

Specifically, after the first etched pattern 231 is formed, the sixth mask layer 24 filling the first etched pattern 231 and covering the surface of the first mask layer may be formed by chemical vapor deposition (CVD), physical vapor deposition (PVD) or atomic layer deposition (ALD). The sixth mask layer 24 and the second mask layer 25 should have a high etch selectivity ratio to facilitate the subsequent selective etching. For example, the etch selectivity ratio is more than 3. The material of the sixth mask layer 24 may be an organic mask layer material, such as a spin-coating carbon material. The material of the second mask layer 25 may be a nitride material, such as silicon nitride.

Figure 2C:
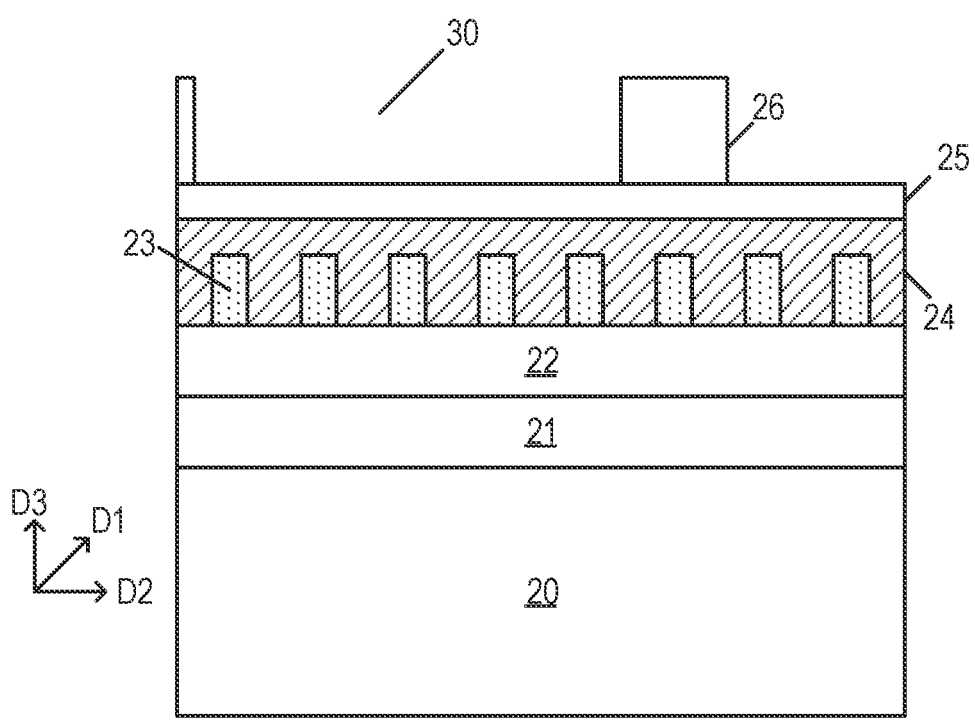

In S14, a third mask layer 26 having a second etched pattern 30 is formed on a surface of the second mask layer 25, as shown in FIG. 2C.

Optionally, the step that the third mask layer 26 having the second etched pattern 30 is formed on the surface of the second mask layer 25 may include the following specific steps.

The third mask layer 26 is deposited on the surface of the second mask layer 25 along a direction perpendicular to the substrate 20, as shown in FIG. 2A.

A photoresist layer 28 is formed on a surface of the third mask layer 26. An opening 29 is provided in the photoresist layer 28, as shown in FIG. 2A.

The third mask layer 26 is etched along the opening 29 to form the second etched pattern 30 in the third mask layer 26.

Specifically, after the second mask layer 25 for covering is formed, the third mask layer 26 and a seventh mask layer 27 are sequentially formed along the direction perpendicular to the substrate 20, and the photoresist layer 28 having the opening 29 is formed on a surface of the seventh mask layer 27, as shown in FIG. 2A and FIG. 2B. The first active line 23 is invisible at an angle shown in FIG. 2B, and is represented by dotted lines. The material of the third mask layer 26 may be an organic mask layer material, and the material of the seventh mask layer 27 may be a nitride material. Thereafter, the seventh mask layer 27 and the third mask layer 26 are sequentially etched along the opening 29, to form the second etched pattern 30 in the third mask layer 26. The third etched pattern 30 may be a trench penetrating through the third mask layer 26 along the direction perpendicular to the substrate 20. The seventh mask layer 27 and the photoresist layer 28 are removed to form the structure as shown in FIG. 2C.

Figure 2D:
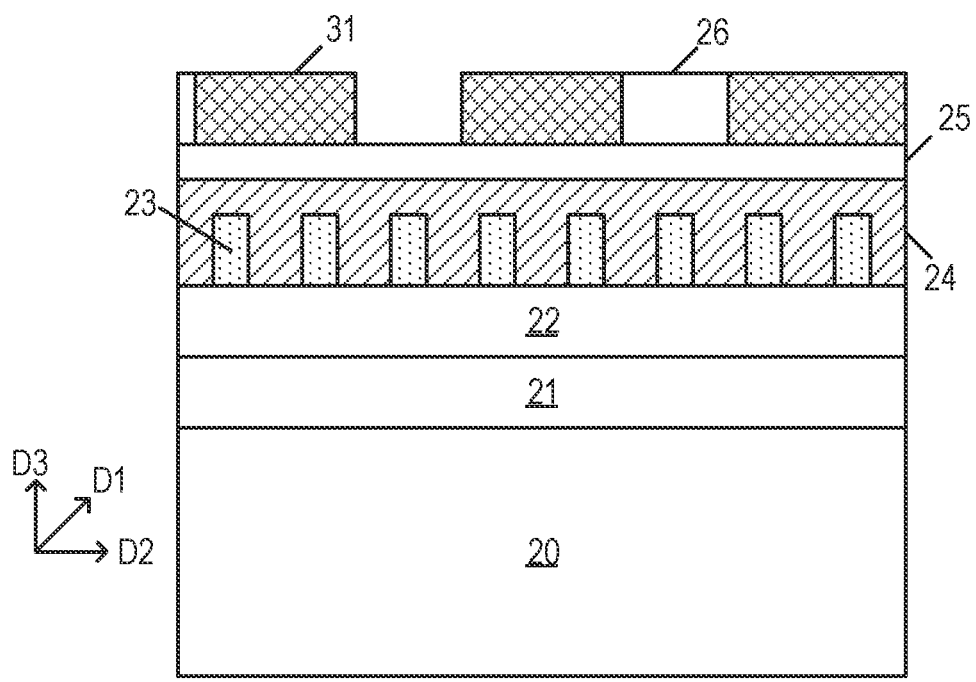

In S15, a flank 31 covering a sidewall of the second etched pattern 30 is formed, as shown in FIG. 2D.

Specifically, after the second etched pattern 30 is formed, an oxide material is deposited on an inner wall of the second etched pattern 30 and a top of the third mask layer 26 by the CVD, PVD or ALD; and thereafter, the oxide material deposited on a bottom wall of the second etched pattern 30 and the top of the third mask layer 26 is removed, the oxide material remained on the sidewall of the second etched pattern 30 serving as the flank 31.

Figure 2E:
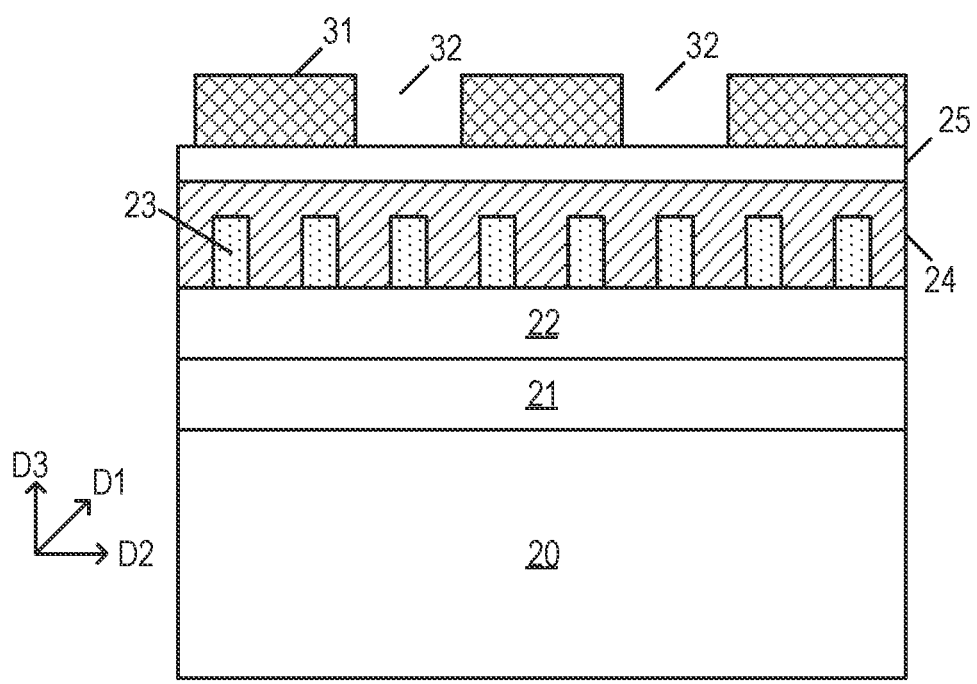
Figure 2F:
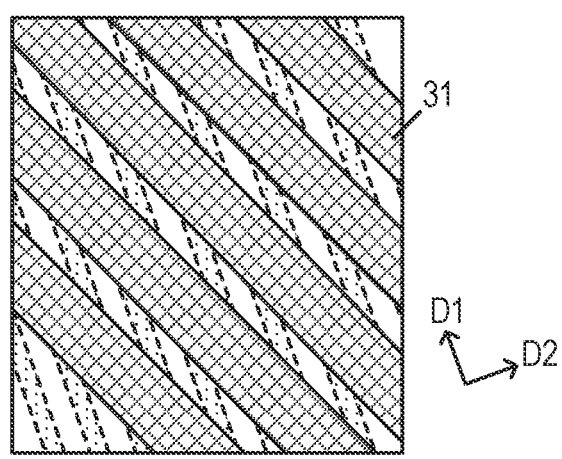
Figure 2G:
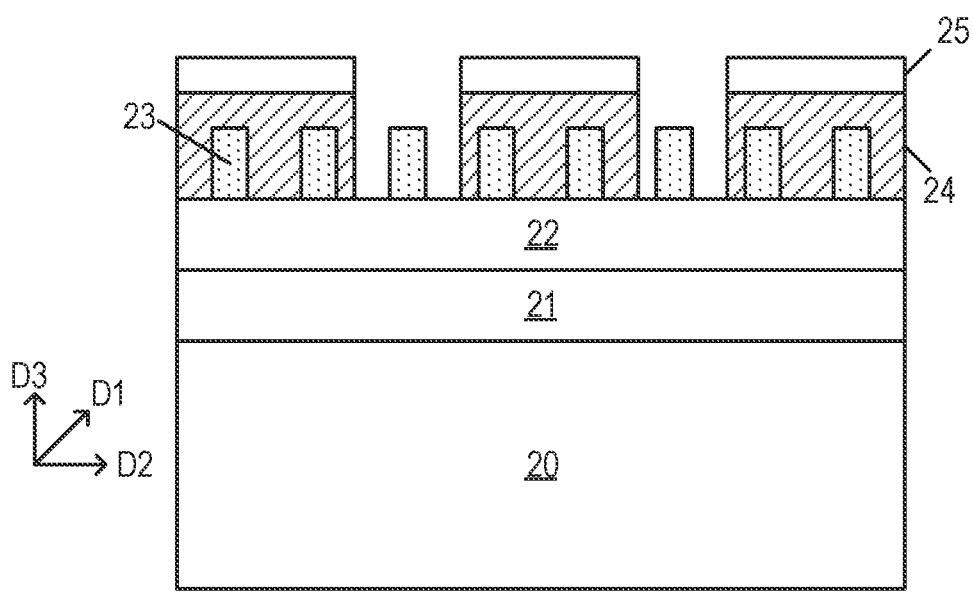
Figure 2H:
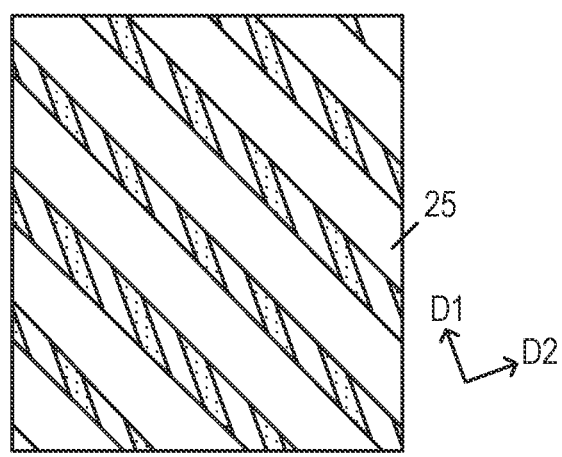

In S16, the third mask layer 26 is removed, to form a third etched pattern 32 between adjacent flanks 31, as shown in FIG. 2E and FIG. 2E. FIG. 2F is a top structural view of the structure shown in FIG. 2E.

Specifically, the material of the flank 31 and the material of the third mask layer 26 should have a high etch selectivity ratio to facilitate selective removal of the third mask layer 26. For example, the etch selectivity ratio is more than 3. After the third mask layer 26 is removed, the trench formed between adjacent flanks 31 and exposing the second mask layer 25 is the third etched pattern 32. The thickness of the flank 31 may be adjusted by those skilled in the art according to an actual requirements, thereby adjusting the width of the third etched pattern 32, and subsequently adjusting a space between adjacent active regions.

Optionally, the first etched pattern 231 and the third etched pattern 32 are trenches, and the third etched pattern 32 is wider than the first etched pattern 231.

Specifically, a relative proportion relationship between the first etched pattern 231 and the third etched pattern 32 may be adjusted by adjusting the thickness of the flank 31. By enabling the third etched pattern 32 to be wider than the first etched pattern 231, the first active line 23 can be fully cut off in the subsequent processes.

Figure 2I:
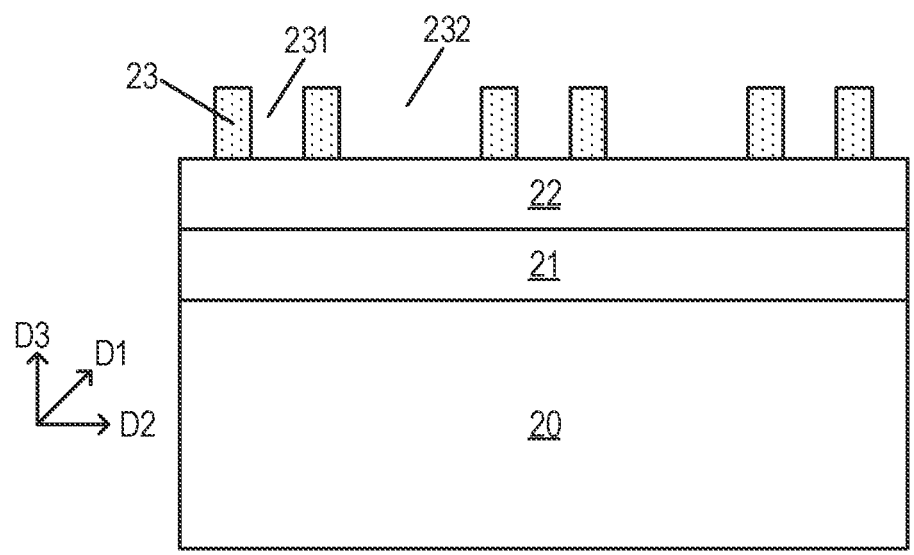
Figure 2J:
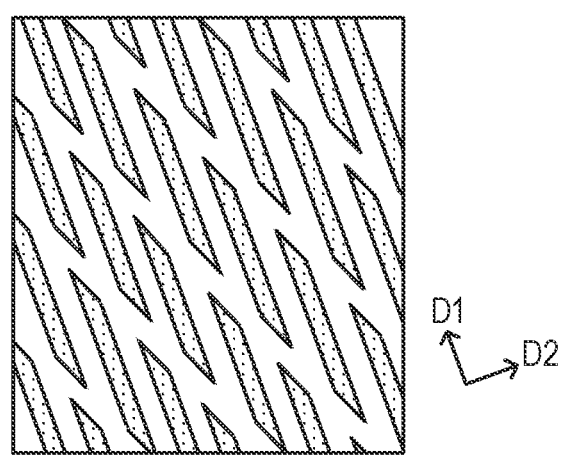
Figure 2K:
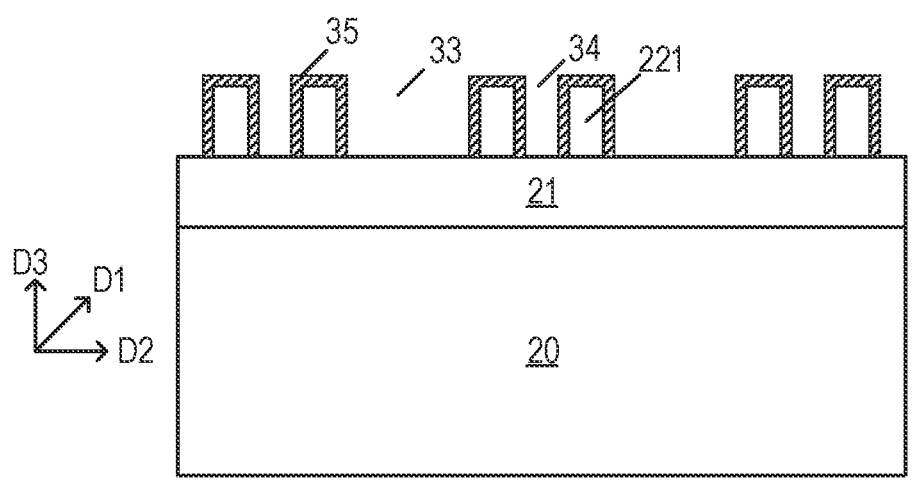
Figure 2L:
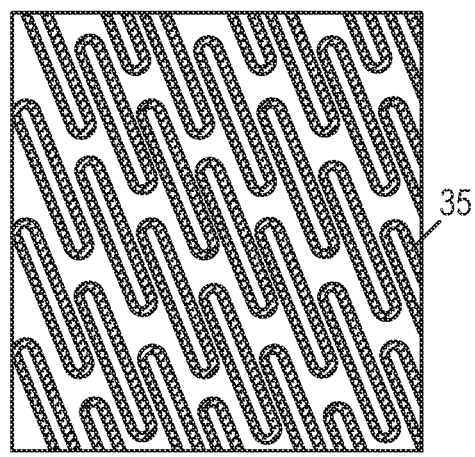

In S17, the first mask layer is etched along the third etched pattern 32 to form a fourth etched pattern 232 in the first mask layer, as shown in FIG. 2I and FIG. 2J. FIG. 2J is a top structural view of the structure shown in FIG. 2I.

Optionally, the step that the fourth etched pattern 232 is formed in the first mask layer include the following specific step.

The second mask layer 25, the sixth mask layer 24 and the first mask layer are sequentially etched along the third etched pattern 32 to form the fourth etched pattern 232 which exposes the fifth mask layer 22, the fourth etched pattern 232 cutting one first active line 23 into multiple segments.

Specifically, the second mask layer 25 and the sixth mask layer 24 are sequentially etched along the fourth etched pattern 232 to expose a part of the region in the first active line 23, as shown in FIG. 2G and FIG. 2H. FIG. 2H is a top structural view of the structure shown in FIG. 2G. Thereafter, the exposed region in the first active line 23 is removed by etching to cut the first active line 23 into multiple separate segments, i.e., the first active line 23 is divided into multiple segments through the fourth etched pattern 232, as shown in FIG. 2I and FIG. 2J.

Figure 3:
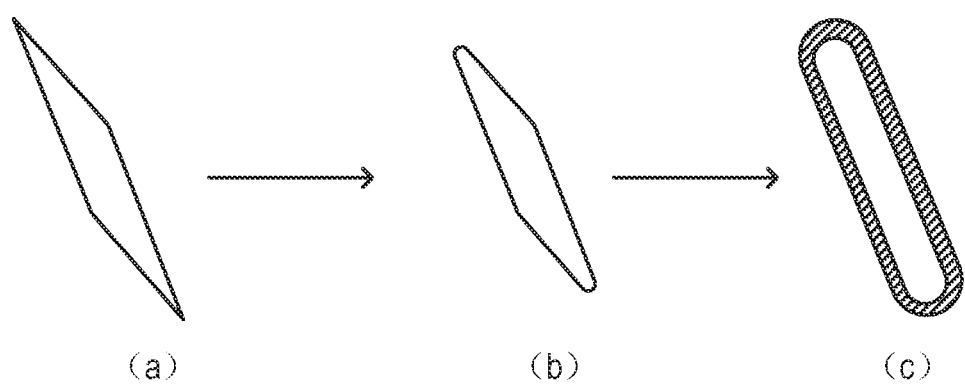
FIG. 3 illustrates a schematic view of a shape change of a mask in an active region in an etching process according to a specific example of the disclosure.

FIG. 3 illustrates a schematic view of shape changes of masks in an active region in the etching processes according to a specific example of the disclosure. Through the etching in this step, the first active line 23 is divided into multiple elongated parallelograms, as shown by a in FIG. 3.

Figure 2M:
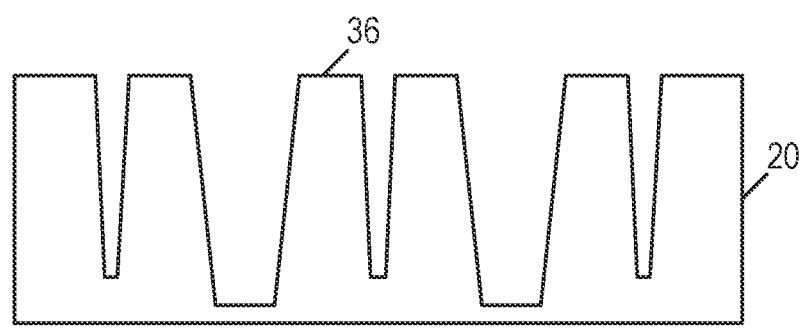
Figure 2N:
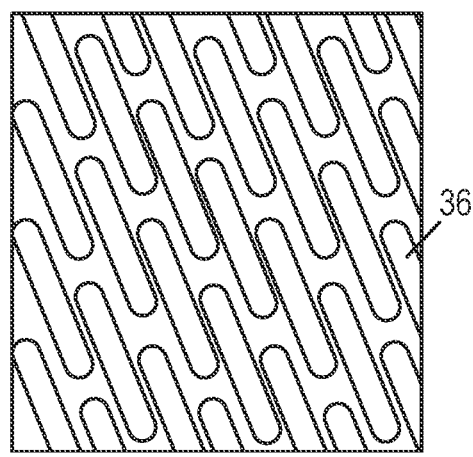

In S18, the substrate 20 is etched along the first etched pattern 231 and the fourth etched pattern 232 to form multiple active regions 36 in the substrate 20, as shown in FIG. 2M and FIG. 2N. FIG. 2N is a top structural view of the structure shown in FIG. 2M.

Optionally, the step that the substrate 20 is etched along the first etched pattern 231 and the fourth etched pattern 232 may include the following specific step.

The fifth mask layer 22 is etched along the first etched pattern 231 and the fourth etched pattern 232, to form a fifth etched pattern 34 and a sixth etched pattern 33, respectively, in the fifth mask layer 22. The fifth etched pattern 34 and the sixth etched pattern 33 divide the fifth mask layer into multiple second active lines 221.

Optionally, the step that the substrate 20 is etched along the first etched pattern 231 and the fourth etched pattern 232 may further include the following specific steps.

A clad layer 35 covering the second active line 221 is formed, as shown in FIG. 2K and FIG. 2L. FIG. 2L is a top structural view of the structure shown in FIG. 2K.

The fourth mask layer 21 and the substrate 20 are sequentially etched along the fifth etched pattern 34 and the sixth etched pattern 33 to form multiple active regions 36 in the substrate 20.

Optionally, the material of the clad layer 35 is the same as that of the fifth mask layer 22.

Specifically, after the first etched pattern 231 and the fourth etched pattern 232 are formed, firstly, the fifth mask layer 22 is etched along the first etched pattern 231 and the fourth etched pattern 232 to form the fifth etched pattern 34 corresponding to the first etched pattern 231 and the sixth etched pattern 33 corresponding to the fourth etched pattern 232 in the fifth mask layer 22. The fifth mask layer 22 is divided into multiple second active lines 221 by the fifth etched pattern 34 and the sixth etched pattern 33. In the process of etching the fifth mask layer 22, the elongated parallelogram changes into a rounded island because of the loading effect of the etching and the consumption of the fifth mask layer 22, as shown by figure b in FIG. 3. Next, the clad layer 35 covering the surface of the second active line 221 is formed by the ALD, as shown in FIG. 2K and FIG. 2L. By forming the clad layer 35, the pattern of the active region is expanded, and at the same time the finally formed active region is further rounded, as shown by c in FIG. 3. Then, the fourth mask layer 21 and the substrate 20 are sequentially etched along the fifth etched pattern 34 and the sixth etched pattern 33 to form multiple active regions 36 in the substrate 20, as shown in FIG. 2M and FIG. 2N. The multiple active regions 36 are arranged in array in the substrate 20.

Furthermore, a specific example further provides a semiconductor structure. For the schematic view of the semiconductor structure, refer to FIG. 2M and FIG. 2N. A semiconductor structure includes:

a substrate;

an active region array, in which the active region array is formed with the method for forming the active region array.

According to the method for forming the active region array and the semiconductor structure provided by the specific examples, after the first mask layer having the first etched pattern is formed on the substrate, the second etched pattern and the third etched pattern are successively formed on the surface of the first mask layer, i.e., the first mask layer is divided by SADP. The disclosure avoids a limitation of the lithography precision of the single-pattern or LELE on the size of an active region, which makes it possible to further reduce the size of the active region, and further increase the density of the active region array in the substrate, thereby improving the performance of the semiconductor structure.

The above are only preferred examples of the disclosure. It should be pointed out that those of ordinary skill in the art may further make multiple modifications and changes without departing from the principle of the disclosure, and those improvements and changes are also should be considered as the protection scope of the disclosure.

The invention claimed is:

1. A method for forming an active region array, comprising the following steps:

providing a substrate;

forming a first mask layer on a surface of the substrate, a first etched pattern being provided in the first mask layer;

forming a second mask layer covering a surface of the first mask layer;

forming a third mask layer having a second etched pattern on a surface of the second mask layer;

forming a flank covering a sidewall of the second etched pattern;

removing the third mask layer to form a third etched pattern between adjacent flanks;

etching the first mask layer along the third etched pattern to form a fourth etched pattern in the first mask layer; and etching the substrate along the first etched pattern and the fourth etched pattern, to form multiple active regions in the substrate.

2. The method for forming the active region array of claim 1, wherein forming the first mask layer on the surface of the substrate comprises the specific steps of:

sequentially forming a fourth mask layer and a fifth mask layer covering a surface of the fourth mask layer on the surface of the substrate;

forming the first mask layer covering a surface of the fifth mask layer; and etching the first mask layer to form multiple first etched patterns, the multiple first etched patterns dividing the first mask layer into multiple first active lines.

3. The method for forming the active region array of claim 2, wherein forming the second mask layer covering the surface of the first mask layer comprises the specific steps of:

depositing a sixth mask layer filling the multiple first etched patterns and covering the surface of the first mask layer; and depositing the second mask layer on a surface of the sixth mask layer.

4. The method for forming the active region array of claim 3, wherein forming the third mask layer having the second etched pattern on the surface of the second mask layer comprises the specific steps of:

depositing the third mask layer on the surface of the second mask layer along a direction perpendicular to the substrate;

forming a photoresist layer on a surface of the third mask layer, an opening being provided in the photoresist layer; and etching the third mask layer along the opening to form the second etched pattern in the third mask layer.

5. The method for forming the active region array of claim 4, wherein forming the fourth etched pattern in the first mask layer comprises the specific step of:

sequentially etching the second mask layer, the sixth mask layer and the first mask layer along the third etched pattern to form the fourth etched pattern exposing the fifth mask layer, the fourth etched pattern cutting one first active line of the multiple first active lines into multiple segments.

6. The method for forming the active region array of claim 2, wherein etching the substrate along the first etched pattern and the fourth etched pattern comprises the specific step of:

etching the fifth mask layer along the multiple first etched patterns and the fourth etched pattern, to respectively form a fifth etched pattern and a sixth etched pattern in the fifth mask layer, the fifth etched pattern and the sixth etched pattern dividing the fifth mask layer into multiple second active lines.

7. The method for forming the active region array of claim 6, wherein etching the substrate along the first etched pattern and the fourth etched pattern further comprises the specific steps of:

forming a clad layer covering the second active lines; and sequentially etching the fourth mask layer and the substrate along the fifth etched pattern and the sixth etched pattern to form the multiple active regions in the substrate.

8. The method for forming the active region array of claim 7, wherein a material of the clad layer is the same as that of the fifth mask layer.

9. The method for forming the active region array of claim 1, wherein the first etched pattern and the third etched pattern are trenches, and the third etched pattern is wider than the first etched pattern.

10. A semiconductor structure, comprising:
the substrate; and
the active region array, wherein the active region array is formed with the method for forming the active region array of claim 1.

11. A semiconductor structure, comprising:
the substrate; and
the active region array, wherein the active region array is formed with the method for forming the active region array of claim 2.

12. A semiconductor structure, comprising:
the substrate; and
the active region array, wherein the active region array is formed with the method for forming the active region array of claim 3.

13. A semiconductor structure, comprising:
the substrate; and
the active region array, wherein the active region array is formed with the method for forming the active region array of claim 4.

14. A semiconductor structure, comprising:
the substrate; and
the active region array, wherein the active region array is formed with the method for forming the active region array of claim 5.

15. A semiconductor structure, comprising:
the substrate; and
the active region array, wherein the active region array is formed with the method for forming the active region array of claim 6.

16. A semiconductor structure, comprising:
the substrate; and
the active region array, wherein the active region array is formed with the method for forming the active region array of claim 7.

17. A semiconductor structure, comprising:
the substrate; and
the active region array, wherein the active region array is formed with the method for forming the active region array of claim 8.

18. A semiconductor structure, comprising:
the substrate; and
the active region array, wherein the active region array is formed with the method for forming the active region array of claim 9.

\* \* \* \* \*